(12) United States Patent
Zhou et al.

(10) Patent No.: US 11,713,394 B2
(45) Date of Patent: Aug. 1, 2023

(54) SHEETS INCLUDING POLYPHENYLENE AND AN ARYL SALICYLATE AND METHODS OF MAKING THE SAME

(71) Applicant: SABIC Global Technologies, B.V., Bergen op Zoom (NL)

(72) Inventors: Jian Zhou, Evansville, IN (US); Juha-Matti Levasalmi, Delmar, NY (US)

(73) Assignee: SABIC GLOBAL TECHNOLOGIES, B.V., Bergen op Zoom (NL)

( * ) Notice: Subject to any disclaimer, the term of this patent is extended or adjusted under 35 U.S.C. 154(b) by 460 days.

(21) Appl. No.: 16/474,963

(22) PCT Filed: Dec. 26, 2017

(86) PCT No.: PCT/US2017/068391
§ 371 (c)(1),
(2) Date: Jun. 28, 2019

(87) PCT Pub. No.: WO2018/136207
PCT Pub. Date: Jul. 26, 2018

(65) Prior Publication Data
US 2019/0345329 A1    Nov. 14, 2019

Related U.S. Application Data

(60) Provisional application No. 62/439,722, filed on Dec. 28, 2016.

(51) Int. Cl.
*C08L 71/10*    (2006.01)
*C08K 5/00*    (2006.01)
(Continued)

(52) U.S. Cl.
CPC ............ *C08L 71/10* (2013.01); *C08K 5/0066* (2013.01); *C08K 5/105* (2013.01); *C08K 5/49* (2013.01);
(Continued)

(58) Field of Classification Search
CPC .......... C08L 71/00; C08L 71/02; C08L 71/08; C08L 71/10; C08L 71/12; C08L 71/123;
(Continued)

(56) References Cited

U.S. PATENT DOCUMENTS 3,971,748 A * 7/1976 Wang ................... C08L 65/02
524/1
4,760,118 A * 7/1988 White .................. C08G 65/485
525/393
(Continued)

FOREIGN PATENT DOCUMENTS

| JP | 2006147551 A | 6/2006 |
|----|--------------|--------|
| JP | 2011126122 A | 6/2011 |

(Continued)

OTHER PUBLICATIONS

Martin B. Jones, Peter Kovacic, in Comprehensive Polymer Science and Supplements, 1989 (Year: 1989).*
(Continued)

*Primary Examiner* — Satya B Sastri
(74) *Attorney, Agent, or Firm* — Cantor Colburn LLP

(57) ABSTRACT

A sheet includes: a composition comprising about (60) to about (85) weight percent of polyphenylene, about (0) to about (10) weight percent of polystyrene, about (10) to about (20) weight percent of a hydrogenated block copolymer of an alkenyl aromatic compound and a conjugated diene, about (3) to about (10) weight percent of an aryl salicylate, and optionally, a flame retardant additive.

17 Claims, 1 Drawing Sheet

(51) Int. Cl.
  *C08K 5/105* (2006.01)
  *C08K 5/49* (2006.01)
  *C08L 25/06* (2006.01)
  *C08L 25/10* (2006.01)
  *C08K 3/04* (2006.01)
  *C08K 3/22* (2006.01)
  *C08K 3/30* (2006.01)

(52) U.S. Cl.
  CPC .............. *C08L 25/06* (2013.01); *C08L 25/10* (2013.01); *C08K 3/04* (2013.01); *C08K 2003/2217* (2013.01); *C08K 2003/3018* (2013.01); *C08L 2201/02* (2013.01)

(58) Field of Classification Search
  CPC ......... C08L 71/126; C08K 5/49; C08K 5/105; C08K 5/134; Y02E 10/50; C08J 5/18; B29C 48/08
  See application file for complete search history.

(56) References Cited

U.S. PATENT DOCUMENTS

| | | | |
|---|---|---|---|
| 4,764,559 A | 8/1988 | Yamauchi et al. | |
| 4,839,425 A * | 6/1989 | Mawatari | C08L 77/00 |
| | | | 525/92 B |
| 6,984,442 B2 | 1/2006 | Brebion et al. | |
| 7,736,727 B2 | 6/2010 | Blackburn et al. | |
| 8,110,632 B2 | 2/2012 | Lietzau et al. | |
| 8,912,261 B2 | 12/2014 | Takamura | |
| 9,050,743 B2 | 6/2015 | Choi et al. | |
| 9,187,640 B2 | 11/2015 | Furukawa et al. | |
| 9,231,335 B2 | 1/2016 | Ishii et al. | |
| 9,284,452 B2 * | 3/2016 | Kono | C08L 71/12 |
| 2005/0080185 A1 | 4/2005 | Whetar | |
| 2006/0089458 A1 * | 4/2006 | Davis | A61L 2/26 |
| | | | 525/92 D |
| 2006/0115667 A1 | 6/2006 | Verrocchi | |
| 2009/0082520 A1 * | 3/2009 | Zijlma | C08L 71/12 |
| | | | 524/578 |
| 2010/0179290 A1 * | 7/2010 | Lietzau | F24S 10/73 |
| | | | 525/92 D |
| 2012/0097220 A1 * | 4/2012 | Miyashita | B32B 27/08 |
| | | | 136/251 |
| 2014/0045979 A1 * | 2/2014 | Ziegler | C08L 71/12 |
| | | | 524/127 |
| 2014/0134417 A1 | 5/2014 | Sharma et al. | |
| 2014/0230887 A1 | 8/2014 | Eguchi et al. | |
| 2016/0075874 A1 | 3/2016 | Song | |
| 2017/0260366 A1 * | 9/2017 | Pfaendner | C08K 5/52 |
| 2019/0322089 A1 | 10/2019 | Zhou et al. | |

FOREIGN PATENT DOCUMENTS

| | | |
|---|---|---|
| JP | 2011146671 A | 7/2011 |
| JP | 2012146698 A | 8/2012 |
| JP | 2013170258 A | 9/2013 |
| KR | 20150067481 A | 6/2015 |
| WO | 2008060738 A1 | 5/2008 |
| WO | 2012030129 A2 | 3/2012 |
| WO | 2015098770 A1 | 7/2015 |
| WO | 2018125855 A1 | 7/2018 |

OTHER PUBLICATIONS https://polysource.net/plastic-resin-families-and-applications/, 2020 (Year: 2020).*
Written Opinion No. PCT/US2017/068391; dated Jul. 19, 2018, pp. 7.
International Search Report No. PCT/US2017/068391; dated Jul. 19, 2018; pp. 11.

* cited by examiner

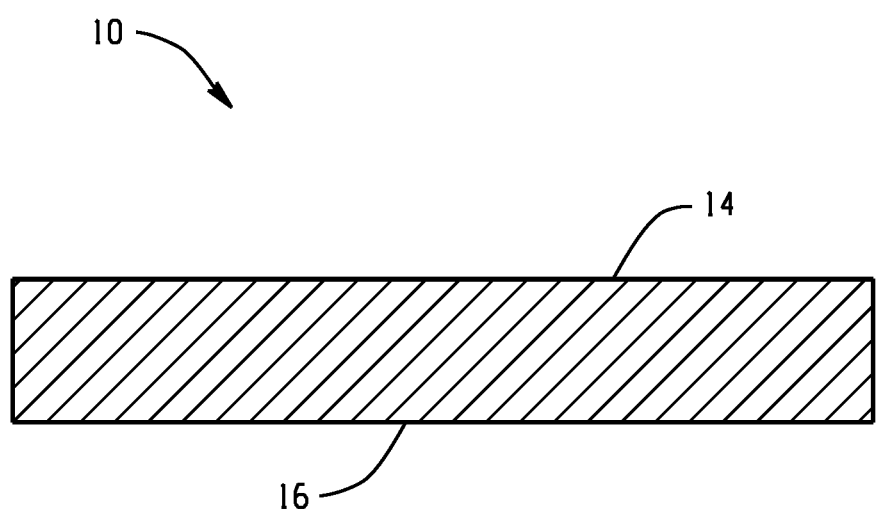

SHEETS INCLUDING POLYPHENYLENE AND AN ARYL SALICYLATE AND METHODS OF MAKING THE SAME

CROSS REFERENCE TO RELATED APPLICATIONS

This application is a National Stage application, i.e., a 371 of PCT/US2017/068391, filed Dec. 26, 2017, which is incorporated herein by reference in its entirety, and which claims the benefit of U.S. Provisional Application No. 62/439,722, filed Dec. 28, 2016.

BACKGROUND

Poly(phenylene ether) based sheets can be used for electrical insulation applications due to desirable mechanical properties such as hydrothermal resistance, electrical insulation, dimensional stability, and potentially halogen-free flame retardance. Poly(phenylene ether) based sheets can be used in various articles such as a backsheet component layer in photovoltaic modules. Poly(phenylene ether) based sheets can suffer from unsatisfactory long-term thermal aging resistance in various applications such as photovoltaic modules and/or solar hot water systems.

Thus, there is a need for poly(phenylene ether) based sheets that have improved long-term thermal aging resistance.

SUMMARY

Disclosed, in various embodiments, are sheets including polyphenylene as well as methods of making thereof.

A sheet comprises: a composition comprising about 60 to about 85 weight percent of polyphenylene, about 0 to about 10 weight percent of polystyrene, about 10 to about 20 weight percent of a hydrogenated block copolymer of an alkenyl aromatic compound and a conjugated diene, about 3 to about 10 weight percent of an aryl salicylate, and optionally, a flame retardant additive.

A method of making a sheet comprises: extruding a sheet, wherein the sheet comprises a composition comprising about 60 to about 75 weight percent of polyphenylene, about 0 to about 10 weight percent of polystyrene, about 10 to about 20 weight percent of a hydrogenated block copolymer of an alkenyl aromatic compound and a conjugated diene, about 3 to about 10 weight percent of an aryl salicylate, and optionally, a flame retardant additive.

A backsheet for a photovoltaic module comprises: a sheet, wherein the sheet comprises a composition comprising about 60 to about 75 weight percent of poly(phenylene ether), about 0 to about 10 weight percent of polystyrene, about 10 to about 20 weight percent of a hydrogenated diblock or triblock copolymer comprising styrene ethylene butene, styrene ethylene butene styrene, or a combination comprising at least one of the foregoing, about 3 to about 10 weight percent of polysalicylate, and about 3 to about 20 weight percent of a flame retardant additive.

These and other features and characteristics are more particularly described below.

BRIEF DESCRIPTION OF THE DRAWINGS

The following is a brief description of the drawings wherein like elements are numbered alike and which are presented for the purposes of illustrating the exemplary embodiments disclosed herein and not for the purposes of limiting the same.

FIG. 1 is a depiction of a sheet as disclosed herein.

DETAILED DESCRIPTION

Disclosed herein are sheets having improved long-term thermal aging resistance as compared to other sheets comprising polyphenylene. For example, the sheet can be a monolayer sheet and can comprise a composition comprising polyphenylene, a hydrogenated block copolymer, an aryl salicylate (e.g., polysalicylate), optionally polystyrene, and optionally a flame retardant additive. Poly(phenylene ether) based sheets generally have good hydrothermal resistance, good electrical insulation, and good dimensional stability. In some instances, the poly(phenylene ether) based sheets can provide halogen free flame retardancy. Electrical insulation films are generally thin, thermoplastic sheets found in electronic components for computers, laptops, televisions, battery assemblies, photovoltaic modules (e.g., backsheets), printers, fax machines, appliances, audio equipment, video equipment, telephones, radios, motors, generators, wires, cables, and the like. Poly(phenylene ether) sheets can be used for each of the above-listed applications. However, the long-term thermal aging resistance of poly(phenylene ether) based sheets can be unsatisfactory for applications requiring long-term heat exposure such as photovoltaic modules and/or solar hot water systems. The sheets disclosed herein can provide sufficient long-term thermal aging resistance, good hydrothermal resistance, good electrical insulation, good dimensional stability, and flame retardancy, halogen free flame retardancy in some instances. The sheet disclosed herein can have a Vicat softening temperature of greater than or equal to 150° C. The Vicat softening temperature can be measured according to the Vicat A test wherein a test specimen is placed in the testing apparatus so that the penetrating needle rests on its surface at least 1 mm from the edge. A load of 10 Newtons (N) can be applied to the specimen. The specimen can then be lowered into an oil bath at 23° C. and the temperature raised at a rate of 120° C. per hour until the needle penetrates 1 mm.

The sheets disclosed herein can comprise a composition comprising about 60 to about 85 weight percent of polyphenylene (e.g., poly(phenylene ether), about to 10 about 20 weight percent of a hydrogenated block copolymer, about 3 to about 10 weight percent of an aryl salicylate (e.g., polysalicylate), optionally 0 to 10 weight percent of polystyrene, and optionally, a flame retardant additive. The hydrogenated block copolymer can comprise an alkenyl aromatic compound and a conjugated diene. Examples of such block copolymers include hydrogenated diblock or triblock copolymers. For example, the hydrogenated block copolymer can include copolymers of polystyrene and polyethylene-butylene, for example, styrene-ethylene-butylene (SEB), styrene-ethylene-butylene-styrene (SEBS), or a combination comprising at least one of the foregoing. When present, the flame retardant additive can be present in an amount of less than or equal to 20 weight percent.

The polyphenylene used in the composition can comprise a poly(phenylene ether). Poly(phenylene ether)s include those comprising repeating structural units having the formula

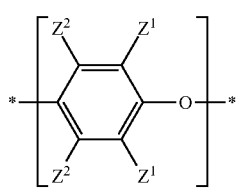

wherein each occurrence of $Z^1$ is independently halogen, unsubstituted or substituted $C_1$-$C_{12}$ hydrocarbyl provided that the hydrocarbyl group is not tertiary hydrocarbyl, $C_1$-$C_{12}$ hydrocarbylthio, $C_1$-$C_{12}$ hydrocarbyloxy, or $C_2$-$C_{12}$ halohydrocarbyloxy wherein at least two carbon atoms separate the halogen and oxygen atoms; and each occurrence of $Z^2$ is independently hydrogen, halogen, unsubstituted or substituted $C_1$-$C_{12}$ hydrocarbyl provided that the hydrocarbyl group is not tertiary hydrocarbyl, $C_1$-$C_{12}$ hydrocarbylthio, $C_1$-$C_{12}$ hydrocarbyloxy, or $C_2$-$C_{12}$ halohydrocarbyloxy wherein at least two carbon atoms separate the halogen and oxygen atoms. As used herein, the term "hydrocarbyl", whether used by itself, or as a prefix, suffix, or fragment of another term, refers to a residue that contains only carbon and hydrogen. The residue can be aliphatic or aromatic, straight-chain, cyclic, bicyclic, branched, saturated, or unsaturated. It can also contain combinations of aliphatic, aromatic, straight chain, cyclic, bicyclic, branched, saturated, and unsaturated hydrocarbon moieties. However, when the hydrocarbyl residue is described as substituted, it may, optionally, contain heteroatoms over and above the carbon and hydrogen members of the substituent residue. Thus, when specifically described as substituted, the hydrocarbyl residue can also contain one or more carbonyl groups, amino groups, hydroxyl groups, or the like, or it can contain heteroatoms within the backbone of the hydrocarbyl residue. As one example, $Z^1$ can be a di-n-butylaminomethyl group formed by reaction of a terminal 3,5-dimethyl-1,4-phenyl group with the di-n-butylamine component of an oxidative polymerization catalyst.

The poly(phenylene ether) can comprise molecules having aminoalkyl-containing end group(s), typically located in a position ortho to the hydroxyl group. Also frequently present are tetramethyldiphenoquinone (TMDQ) end groups, typically obtained from 2,6-dimethylphenol-containing reaction mixtures in which tetramethyldiphenoquinone by-product is present. The poly(phenylene ether) can be in the form of a homopolymer, a copolymer, a graft copolymer, an ionomer, or a block copolymer, as well as combinations thereof.

In some embodiments, the poly(phenylene ether) has an intrinsic viscosity of 0.25 to 1 deciliter per gram measured by Ubbelohde viscometer at 25° C. in chloroform. For example, the poly(phenylene ether) intrinsic viscosity can be 0.25 to 0.5 deciliter per gram, or or 0.4 to 0.5 deciliter per gram, or 0.4 to 0.46 deciliter per gram.

In some embodiments, the poly(phenylene ether) comprises a homopolymer or copolymer of monomers selected from the group consisting of 2,6-dimethylphenol, 2,3,6-trimethylphenol, and combinations thereof. Desirable poly (phenylene ether) homopolymers are commercially available as, for example, NORYL* PPO* 640 and 646 Resins from SABIC, and XYRON* S201A and S202A Resins from Asahi Kasei Chemicals Corporation.

The composition comprises the poly(phenylene ether) in an amount of 60 to 85 parts by weight, based on 100 parts by weight total of the poly(phenylene ether), the hydrogenated block copolymer, the aryl salicylate, the optional polystyrene, and the optional flame retardant. Within this range, the poly(phenylene ether) amount can be 65 to 80 parts by weight, for example, 67 to 78 parts by weight.

In some embodiments, the poly(phenylene ether) can be capped with an end capping agent. To produce the capped poly(phenylene ether), the poly(phenylene ether) is reacted in with at least one ester of salicylic acid or anthranilic acid or a substituted derivative thereof in a solvent. As used herein, the term "ester of salicylic acid" includes compounds in which the carboxy group, the hydroxy group or both have been esterified.

Other than as defined above, the precise molecular structure of the ester is not critical. Various substituents may be present on the salicylate ring, including, for example, alkyl, aryl, alkoxy, acyl, nitro, carbalkoxy and nitro. Desirable capping agents are aryl salicylates such as phenyl salicylate, aspirin (i.e., acetylsalicylic acid), salicylic carbonate and polysalicylates (PSAL), including both linear polysalicylates and cyclic compounds such as disalicylide and trisalicylide.

End capping can be achieved by reactive extrusion or other means of melt mixing poly(phenylene ether) and the capping agent at melt temperatures in the 260° C. to 340° C. range, or alternatively, the poly(phenylene ether) can be heated in solution with the capping agent. Reaction temperatures are about 160° to about 300° C. Aromatic solvents such as benzene, toluene, xylene and o-dichlorobenzene, tetrachloromethane, trichloromethane, dichloromethane, 1,2-dichloroethane can be used. The molar proportion of capping agent will to some extent depend on the molecular weight and level of hydroxyl end groups in the poly(phenylene ether), as well as other hydroxy-substituted "tail" end groups resulting from equilibration with diphenoquinone. About 1-10 molar equivalents, most often about 2-4 molar equivalents, and preferably about 2.5-3.5 molar equivalents of capping agent, based on poly(phenylene ether) hydroxyl number, is usually sufficient.

It is also contemplated to optionally include at least one polystyrene in the composition. The term "polystyrene" as used herein includes polymers prepared by methods known in the art including bulk, suspension and emulsion polymerization, which contain at least 25% by weight of structural units derived from a monomer of the formula

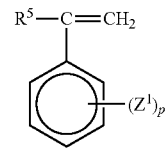

wherein $R^5$ is hydrogen, lower alkyl or halogen; $Z^1$ is vinyl, halogen or lower alkyl; and p is from 0 to 5. These resins include homopolymers of styrene, chlorostyrene and vinyltoluene, random copolymers of styrene with one or more monomers illustrated by acrylonitrile, butadiene, alpha-methylstyrene, ethylvinylbenzene, divinylbenzene and maleic anhydride, and rubber-modified polystyrenes comprising blends and grafts, wherein the rubber is a polybutadiene or a rubbery copolymer of about 98-70% styrene and about 2-30% diene monomer. Polystyrenes are known to be miscible with poly(phenylene ether) in all proportions, and any such blend may contain polystyrene in amounts of about 5-95% and most often about 25-75%, based on total resins.

The capped poly(phenylene ether) can provide advantages as compared to uncapped poly(phenylene ether). For example, capped poly(phenylene ether) is less susceptible to oxidative degradation at high temperatures. This is demonstrated by an increase in time to embrittlement upon heat aging in air, and also by a decrease in oxygen uptake under high-temperature conditions. For the most part, tensile properties are not materially affected by capping. Additionally, the capped poly(phenylene ether) reduces to a large part the radical scavenging the capability of the poly(phenylene ether). Thus, capped poly(phenylene ether) is useful in process that involve radical initiation and/or reactions, e.g., styrene polymerization processes as well as unsaturated polyester, allylic, and bismaleimide thermosetting resins.

Depending on the capping agent used, the glass transition and heat distortion temperatures of the capped polymers may be lower than those of the corresponding uncapped poly(phenylene ether). For example, linear polysalicylates are found to cause a greater decrease in said temperatures than salicylic carbonate. This phenomenon is apparently the result of various by-products which plasticize the poly (phenylene ether). The plasticization effect may be decreased or eliminated by dissolving and re-precipitating the polymer after capping, thus removing the plasticizing materials.

In addition to the poly(phenylene ether), the composition comprises a hydrogenated block copolymer of an alkenyl aromatic monomer and a conjugated diene. For brevity, this component is referred to as the "hydrogenated block copolymer". The hydrogenated block copolymer can comprise 10 to 90 weight percent of poly(alkenyl aromatic) content and 90 to 10 weight percent of hydrogenated poly(conjugated diene) content, based on the weight of the hydrogenated block copolymer. In some embodiments, the hydrogenated block copolymer is a low poly(alkenyl aromatic content) hydrogenated block copolymer in which the poly(alkenyl aromatic) content is 10 to less than 40 weight percent, or 20 to 35 weight percent, or 25 to 35 weight percent, or 30 to 35 weight percent, all based on the weight of the low poly (alkenyl aromatic) content hydrogenated block copolymer. In other embodiments, the hydrogenated block copolymer is a high poly(alkenyl aromatic content) hydrogenated block copolymer in which the poly(alkenyl aromatic) content is 40 to 90 weight percent, or 50 to 80 weight percent, or 60 to 70 weight percent, all based on the weight of the high poly (alkenyl aromatic content) hydrogenated block copolymer.

In some embodiments, the hydrogenated block copolymer has a weight average molecular weight of 40,000 to 200,000 atomic mass units. The number average molecular weight and the weight average molecular weight can be determined by gel permeation chromatography and based on comparison to polystyrene standards. In some embodiments, the hydrogenated block copolymer has a weight average molecular weight of 50,000 to 100,000 atomic mass units, or 100,000 to 150,000 atomic mass units.

Molecular weight (as used herein, reference to molecular weight refers to weight average molecular weight (Mw)) of the hydrogenated block copolymer can have an effect on the ability to produce the sheet. For example, the use of a higher molecular weight hydrogenated block copolymer (e.g., having a Mw of 200,000 to 400,000) can cause the viscosity of the composition to be such that it cannot be processed to form the sheet. The use of a lower molecular weight hydrogenated block copolymer (e.g., having a Mw of 100,000 to 150,000) can allow the composition to have a viscosity sufficient to allow easier processing into a sheet as disclosed herein. The use of higher molecular weight hydrogenated block copolymers can increase the viscosity of the composition, making it challenging to process. The use of higher molecular weight hydrogenated block copolymers can also cause die swell in the extruder, also making it challenging to process.

The alkenyl aromatic monomer used to prepare the hydrogenated block copolymer can have the structure

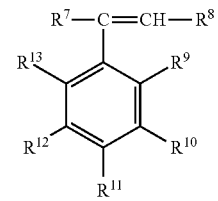

wherein $R^7$ and $R^8$ each independently represent a hydrogen atom, a $C_1$-$C_8$ alkyl group, or a $C_2$-$C_8$ alkenyl group; $R^9$ and $R^{13}$ each independently represent a hydrogen atom, a $C_1$-$C_8$ alkyl group, a chlorine atom, or a bromine atom; and $R^{10}$, $R^{11}$, and $R^{12}$ each independently represent a hydrogen atom, a $C_1$-$C_8$ alkyl group, or a $C_2$-$C_8$ alkenyl group, or $R^{10}$ and $R^{11}$ are taken together with the central aromatic ring to form a naphthyl group, or $R^{11}$ and $R^{12}$ are taken together with the central aromatic ring to form a naphthyl group. Specific alkenyl aromatic monomers include, for example, styrene, chlorostyrenes such as p-chlorostyrene, methylstyrenes such as alpha-methylstyrene and p-methylstyrene, and t-butylstyrenes such as 3-t-butylstyrene and 4-t-butylstyrene. In some embodiments, the alkenyl aromatic monomer is styrene.

The conjugated diene used to prepare the hydrogenated block copolymer can be a $C_4$-$C_{20}$ conjugated diene. Suitable conjugated dienes include, for example, 1,3-butadiene, 2-methyl-1,3-butadiene, 2-chloro-1,3-butadiene, 2,3-dimethyl-1,3-butadiene, 1,3-pentadiene, 1,3-hexadiene, and the like, and combinations thereof. In some embodiments, the conjugated diene is 1,3-butadiene, 2-methyl-1,3-butadiene, or a combination thereof. In some embodiments, the conjugated diene is 1,3-butadiene.

The hydrogenated block copolymer is a copolymer comprising (A) at least one block derived from an alkenyl aromatic compound and (B) at least one block derived from a conjugated diene, in which the aliphatic unsaturated group content in the block (B) is at least partially reduced by hydrogenation. In some embodiments, the aliphatic unsaturation in the (B) block is reduced by at least 50 percent, or at least 70 percent. The arrangement of blocks (A) and (B) includes a linear structure, a grafted structure, and a radial teleblock structure with or without a branched chain. Linear block copolymers include tapered linear structures and non-tapered linear structures. In some embodiments, the hydrogenated block copolymer has a tapered linear structure. In some embodiments, the hydrogenated block copolymer has a non-tapered linear structure. In some embodiments, the hydrogenated block copolymer comprises a (B) block that comprises random incorporation of alkenyl aromatic monomer. Linear block copolymer structures include diblock (A-B block), triblock (A-B-A block or B-A-B block), tetrablock (A-B-A-B block), and pentablock (A-B-A-B-A block or B-A-B-A-B block) structures as well as linear structures containing 6 or more blocks in total of (A) and (B), wherein the molecular weight of each (A) block can be the same as or different from that of other (A) blocks, and the molecular weight of each (B) block can be the same as or different from that of other (B) blocks. In some embodiments, the hydrogenated block copolymer is a diblock copolymer, a triblock copolymer, or a combination comprising at least one of the foregoing.

In some embodiments, the hydrogenated block copolymer comprises a polystyrene-poly(ethylene-butylene-styrene)-polystyrene tapered block copolymer. For brevity, this component is referred to as the "tapered block copolymer". Tapered block copolymers are also known as controlled distribution block copolymers. In some embodiments, the tapered block copolymer has a polystyrene content of 30 to 70 weight percent, or 35 to 65 weight percent, based on the weight of the tapered block copolymer. In some embodiments, the tapered block copolymer has a melt flow rate of 0 to 10 grams per 10 minutes, measured at 260° C. and 5 kilogram load according to ASTM D1238-13. Tapered block copolymers are commercially available as, for example, KRATON™ A1535 and A1536 Resins from Kraton Performance Polymers.

The hydrogenated block copolymer can consist of polystyrene-poly(ethylene-butylene)-polystyrene triblock copolymer. Alternatively, the hydrogenated block copolymer can comprise polystyrene-poly(ethylene-butylene)-polystyrene triblock copolymer and tapered block copolymer. For example, the 5 to 40 parts by weight of the hydrogenated block copolymer can comprise 3 to 12 parts by weight of polystyrene-poly(ethylene-butylene)-polystyrene triblock copolymer and 22 to 35 parts by weight of the tapered block copolymer. Alternatively, the hydrogenated block copolymer can consist of the tapered block copolymer. In some embodiments, the hydrogenated block copolymer comprises 70 to 100 weight percent of a polystyrene-poly(ethylene-butylene-styrene)-polystyrene tapered block copolymer, based on the weight of the hydrogenated block copolymer.

In some embodiments, the hydrogenated block copolymer excludes the residue of monomers other than the alkenyl aromatic compound and the conjugated diene. In some embodiments, the hydrogenated block copolymer consists of blocks derived from the alkenyl aromatic compound and the conjugated diene. It does not comprise grafts formed from these or any other monomers. It also consists of carbon and hydrogen atoms and therefore excludes heteroatoms. In some embodiments, the hydrogenated block copolymer includes the residue of one or more acid functionalizing agents, such as maleic anhydride.

Methods for preparing hydrogenated block copolymers are known in the art and many hydrogenated block copolymers are commercially available. Illustrative commercially available hydrogenated block copolymers include the polystyrene-poly(ethylene-propylene) diblock copolymers available from Kraton Performance Polymers Inc. as KRATON™ G1701 (having about 37 weight percent polystyrene) and G1702 (having about 28 weight percent polystyrene); the polystyrene-poly(ethylene-butylene)-polystyrene triblock copolymers available from Kraton Performance Polymers Inc. as KRATON™ G1641 (having about 33 weight percent polystyrene), G1650 (having about 30 weight percent polystyrene), G1651 (having about 33 weight percent polystyrene), and G1654 (having about 31 weight percent polystyrene); and the polystyrene-poly(ethylene-ethylene/propylene)-polystyrene triblock copolymers available from Kuraray as SEPTON™ S4044, S4055, S4077, and S4099.

Additional commercially available hydrogenated block copolymers include polystyrene-poly(ethylene-butylene)-polystyrene (SEBS) triblock copolymers available from Dynasol as CALPRENE™ H6140 (having about 31 weight percent polystyrene), H6170 (having about 33 weight percent polystyrene), H6171 (having about 33 weight percent polystyrene), and H6174 (having about 33 weight percent polystyrene), and from Kuraray as SEPTON™ 8006 (having about 33 weight percent polystyrene) and 8007 (having about 30 weight percent polystyrene); polystyrene-poly(ethylene-butylene-styrene)-polystyrene tapered block copolymers available from Kraton Performance Polymers as KRATON™ A1535 (having 56.3-60.3 weight percent polystyrene) and A1536 (having 37-44 weight percent polystyrene); polystyrene-poly(ethylene-propylene)-polystyrene (SEPS) copolymers available from Kuraray as SEPTON™ 2006 (having about 35 weight percent polystyrene) and 2007 (having about 30 weight percent polystyrene); and oil-extended compounds of these hydrogenated block copolymers available from Kraton Performance Polymers Inc. as KRATON™ G4609 (containing about 45% mineral oil, and the SEBS having about 33 weight percent polystyrene) and G4610 (containing about 31% mineral oil, and the SEBS having about 33 weight percent polystyrene); and from Asahi as TUFTEC™ H1272 (containing about 36% oil, and the SEBS having about 35 weight percent polystyrene). Mixtures of two of more hydrogenated block copolymers can be used.

The composition comprises the hydrogenated block copolymer in an amount of 10 to 20 parts by weight, based on 100 parts by weight total of the poly(phenylene ether), the hydrogenated block copolymer, the aryl salicylate, the optional polystyrene, and the optional flame retardant.

Depending on the application, the sheet composition can optionally further include various additives, for example, a flame retardant additive in an amount of 3 to 20 weight percent. The flame retardant additive can assist in providing low smoke and low heat release properties to the overall sheet when desired. The flame retardant additive can comprise a halogen containing flame retardant additive, a non-halogen containing flame retardant additive, or a combination comprising at least one of the foregoing. The halogen containing flame retardant additive can include a phosphorous containing flame retardant additive.

Flame retardants that can be included in the sheet composition can be organic compounds that include phosphorus, bromine, and/or chlorine. Non-brominated and non-chlorinated phosphorus-containing flame retardants can be preferred in certain applications for regulatory reasons, for example organic phosphates and organic compounds containing phosphorus-nitrogen bonds.

One type of exemplary organic phosphate is an aromatic phosphate of the formula $(GO)_3P\!\!=\!\!O$, wherein each G is independently an alkyl, cycloalkyl, aryl, alkylaryl, or arylalkyl group, provided that at least one G is an aromatic group. Two of the G groups can be joined together to provide a cyclic group, for example, diphenyl pentaerythritol diphosphate. Other suitable aromatic phosphates can be, for example, phenyl bis(dodecyl) phosphate, phenyl bis(neopentyl) phosphate, phenyl bis(3,5,5'-trimethylhexyl) phosphate, ethyl diphenyl phosphate, 2-ethylhexyl di(p-tolyl) phosphate, bis(2-ethylhexyl) p-tolyl phosphate, tritolyl phosphate, bis(2-ethylhexyl) phenyl phosphate, tri(nonylphenyl) phosphate, bis(dodecyl) p-tolyl phosphate, dibutyl phenyl phosphate, 2-chloroethyl diphenyl phosphate, p-tolyl bis(2,5,5'-trimethylhexyl) phosphate, 2-ethylhexyl diphenyl phosphate, or the like. A specific aromatic phosphate is one in which each G is aromatic, for example, triphenyl phosphate, tricresyl phosphate, isopropylated triphenyl phosphate, and the like.

Di- or polyfunctional aromatic phosphorus-containing compounds are also useful, for example, compounds of the formulas below:

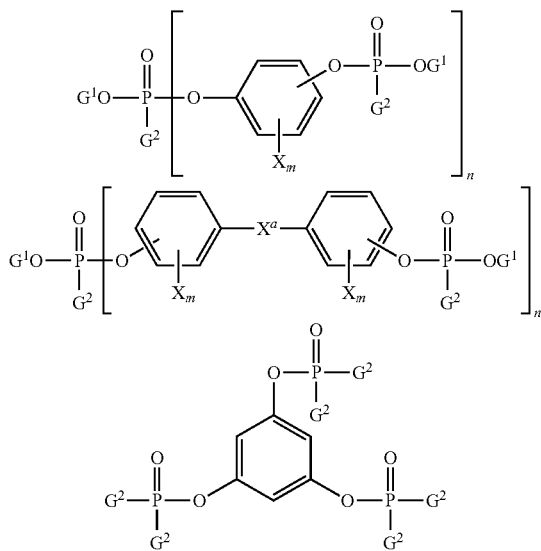

wherein each $G^1$ is independently a hydrocarbon having 1 to 30 carbon atoms; each $G^2$ is independently a hydrocarbon or hydrocarbonoxy having 1 to 30 carbon atoms; each $X^a$ is independently a hydrocarbon having 1 to 30 carbon atoms; each X is independently a bromine or chlorine; m is 0 to 4, and n is 1 to 30. Examples of suitable di- or polyfunctional aromatic phosphorus-containing compounds include resorcinol tetraphenyl diphosphate (RDP), the bis(diphenyl) phosphate of hydroquinone and the bis(diphenyl) phosphate of bisphenol-A, respectively, their oligomeric and polymeric counterparts, and the like.

Specific aromatic organophosphorus compounds have two or more phosphorus-containing groups, and are inclusive of acid esters of formula (20)

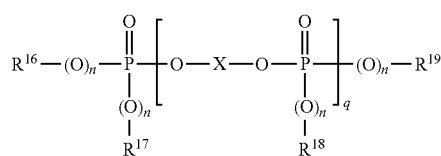

wherein $R^{16}$, $R^{17}$, $R^{18}$, and $R^{19}$ are each independently $C_{1-8}$ alkyl, $C_{5-6}$ cycloalkyl, $C_{6-20}$ aryl, or $C_{7-12}$ arylalkylene, each optionally substituted by $C_{1-12}$ alkyl, specifically by $C_{1-4}$ alkyl and X is a mono- or poly-nuclear aromatic $C_{6-30}$ moiety or a linear or branched $C_{2-30}$ aliphatic radical, which can be OH-substituted and can contain up to 8 ether bonds, provided that at least one of $R^{16}$, $R^{17}$, $R^{18}$, $R^{19}$, and X is an aromatic group. In some embodiments $R^{16}$, $R^{17}$, $R^{18}$, and $R^{19}$ are each independently $C_{1-4}$ alkyl, naphthyl, phenyl($C_{1-4}$)alkylene, or aryl groups optionally substituted by $C_{1-4}$ alkyl. Specific aryl moieties are cresyl, phenyl, xylenyl, propylphenyl, or butylphenyl. In some embodiments X in formula (20) is a mono- or poly-nuclear aromatic $C_{6-30}$ moiety derived from a diphenol. Further in formula (20), n is each independently 0 or 1; in some embodiments n is equal to 1. Also in formula (20), q is from 0.5 to 30, from 0.8 to 15, from 1 to 5, or from 1 to 2. In some embodiments, $R^{16}$, $R^{17}$, $R^{18}$ and $R^{19}$ are each independently non-alkylated $C_{6-20}$ aryl, and X is a mono- or poly-nuclear aromatic $C_{6-30}$ moiety, n is each independently 0 or 1, and q is from 0.5 to 30.

In these embodiments, each of $R^{16}$, $R^{17}$, $R^{18}$, and $R^{19}$ can be aromatic, i.e., phenyl, n is 1, and p is 1-5, specifically 1-2, and X can be represented by the following divalent groups (21), or a combination comprising one or more of these divalent groups,

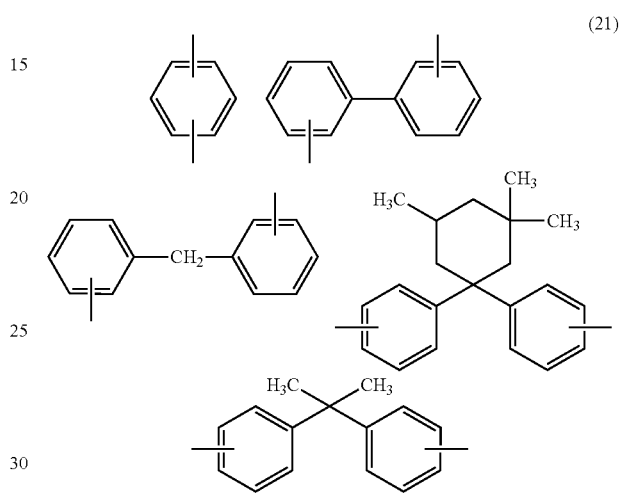

wherein the monophenylene and bisphenol-A groups can be specifically mentioned. In some embodiments at least one of $R^{16}$, $R^{17}$, $R^{18}$, $R^{19}$, and X corresponds to a monomer used to form the polycarbonate, e.g., bisphenol-A or resorcinol. In another embodiment, X is derived especially from resorcinol, hydroquinone, bisphenol-A, or diphenylphenol, and $R^{16}$, $R^{17}$, $R^{18}$, $R^{19}$, is aromatic, specifically phenyl. A specific aromatic organophosphorus compound of this type is resorcinol bis(diphenyl phosphate), also known as RDP. Another specific class of aromatic organophosphorus compounds having two or more phosphorus-containing groups are compounds of formula (22)

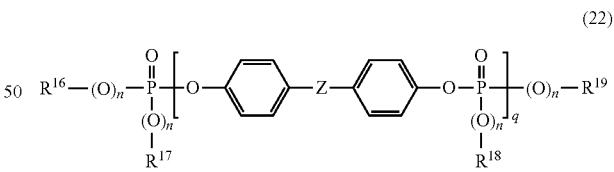

wherein $R^{16}$, $R^{17}$, $R^{18}$, $R^{19}$, n, and q are as defined for formula (20) and wherein Z is $C_{1-7}$ alkylidene, $C_{1-7}$ alkylene, $C_{5-12}$ cycloalkylidene, —O—, —S—, —SO$_2$—, or —CO—, specifically isopropylidene. A specific aromatic organophosphorus compound of this type is bisphenol-A bis(diphenyl phosphate), also known as BPADP, wherein $R^{16}$, $R^{17}$, $R^{18}$, and $R^{19}$ are each phenyl, each n is 1, and q is from 1 to 5, from 1 to 2, or 1.

Exemplary suitable flame retardant compounds containing phosphorus-nitrogen bonds include phosphonitrilic chloride, phosphorus ester amides, phosphoric acid amides, phosphonic acid amides, phosphinic acid amides, tris (aziridinyl) phosphine oxide. When present, phosphorus-containing flame retardants can be present in amounts of 0.1 to 10 percent by weight, based on the total weight of the poly(phenylene ether), the hydrogenated block copolymer, the aryl salicylate, the optional polystyrene, and the optional flame retardant.

Halogenated materials can also be used as flame retardants, for example 2,2-bis-(3,5-dichlorophenyl)-propane; bis-(2-chlorophenyl)-methane; bis(2,6-dibromophenyl)-methane; 1,1-bis-(4-iodophenyl)-ethane; 1,2-bis-(2,6-dichlorophenyl)-ethane; 1,1-bis-(2-chloro-4-iodophenyl)ethane; 1,1-bis-(2-chloro-4-methylphenyl)-ethane; 1,1-bis-(3,5-dichlorophenyl)-ethane; 2,2-bis-(3-phenyl-4-bromophenyl)-ethane; 2,6-bis-(4,6-dichloronaphthyl)-propane; 2,2-bis-(2,6-dichlorophenyl)-pentane; 2,2-bis-(3,5-dibromophenyl)-hexane; bis-(4-chlorophenyl)-phenyl-methane; bis-(3,5-dichlorophenyl)-cyclohexylmethane; bis-(3-nitro-4-bromophenyl)-methane; bis-(4-hydroxy-2,6-dichloro-3-methoxyphenyl)-methane; and 2,2-bis-(3,5-dichloro-4-hydroxyphenyl)-propane 2,2 bis-(3-bromo-4-hydroxyphenyl)-propane. Also included within the above structural formula are: 1,3-dichlorobenzene, 1,4-dibromobenzene, 1,3-dichloro-4-hydroxybenzene, and biphenyls such as 2,2'-dichlorobiphenyl, polybrominated 1,4-diphenoxybenzene, 2,4'-dibromobiphenyl, and 2,4'-dichlorobiphenyl as well as decabromo diphenyl oxide, and the like.

Also useful are oligomeric and polymeric halogenated aromatic compounds, such as a copolycarbonate of bisphenol A and tetrabromobisphenol A and a carbonate precursor, e.g., phosgene. Metal synergists, e.g., antimony oxide, can also be used with the flame retardant. When present, halogen containing flame retardants can be present in amounts of 0.1 to 30 percent by weight, based on the total weight of the poly(phenylene ether), the hydrogenated block copolymer, the aryl salicylate, the optional polystyrene, and the optional flame retardant, for example, 5 to 30 percent by weight.

Inorganic flame retardants can also be used, for example salts of $C_{1-16}$ alkyl sulfonate salts such as potassium perfluorobutane sulfonate (Rimar salt), potassium perfluoroctane sulfonate, tetraethylammonium perfluorohexane sulfonate, and potassium diphenylsulfone sulfonate, and the like; salts formed by reacting for example an alkali metal or alkaline earth metal (for example lithium, sodium, potassium, magnesium, calcium and barium salts) and an inorganic acid complex salt, for example, an oxo-anion, such as alkali metal and alkaline-earth metal salts of carbonic acid, such as $Na_2CO_3$, $K_2CO_3$, $MgCO_3$, $CaCO_3$, and $BaCO_3$ or fluoro-anion complexes such as $Li_3AlF_6$, $BaSiF_6$, $KBF_4$, $K_3AlF_6$, $KAlF_4$, $K_2SiF_6$, and/or $Na_3AlF_6$ or the like. When present, inorganic flame retardant salts can be present in amounts of 0.1 to 5 percent by weight, based on the total weight of the poly(phenylene ether), the hydrogenated block copolymer, the aryl salicylate, the optional polystyrene, and the optional flame retardant.

Anti-drip agents can also be used, for example a fibril forming or non-fibril forming fluoropolymer such as polytetrafluoroethylene (PTFE). The anti-drip agent can be encapsulated by a rigid copolymer as described above, for example styrene-acrylonitrile copolymer (SAN). PTFE encapsulated in SAN is known as TSAN, and can also be used as a flame retardant. Encapsulated fluoropolymers can be made by polymerizing the encapsulating polymer in the presence of the fluoropolymer, for example an aqueous dispersion. TSAN can provide significant advantages over PTFE, in that TSAN can be more readily dispersed in the composition. An exemplary TSAN can comprise, for example, 50 wt % PTFE and 50 wt % SAN, based on the total weight of the encapsulated fluoropolymer. The SAN can comprise, for example, 75 wt % styrene and 25 wt % acrylonitrile based on the total weight of the copolymer. Alternatively, the fluoropolymer can be pre-blended in some manner with a second polymer, such as for, example, an aromatic polycarbonate SAN to form an agglomerated material for use as an anti-drip agent. Either method can be used to produce an encapsulated fluoropolymer. Antidrip agents can be used in amounts of 0.1 to 5 percent by weight, based on the total weight of the polycarbonatesiloxane-arylate and any additional polymer.

The sheet composition can further include impact modifier(s). Exemplary impact modifiers include natural rubber, fluoroelastomers, ethylene-propylene rubber (EPR), ethylene-butene rubber, ethylene-propylene-diene monomer rubber (EPDM), acrylate rubbers, hydrogenated nitrile rubber (HNBR) silicone elastomers, and elastomer-modified graft copolymers such as styrene-butadiene-styrene (SBS), styrene-butadiene rubber (SBR), styrene-ethylene-butadiene-styrene (SEBS), acrylonitrile-butadiene-styrene (ABS), acrylonitrile-ethylene-propylene-diene-styrene (AES), styrene-isoprene-styrene (SIS), methyl methacrylate-butadiene-styrene (MBS), high rubber graft (HRG), and the like. Impact modifiers are generally present in amounts of 1 to 30 wt. %, based on the total weight of the other components of the composition.

The sheet composition can include various additives ordinarily incorporated into polymer compositions of this type, with the proviso that the additive(s) are selected so as to not significantly adversely affect the desired properties of the polymeric composition, in particular hydrothermal resistance, tensile strength, long-term thermal aging performance, and thermal shrinkage. Such additives can be mixed at a suitable time during the mixing of the components for forming the composition. Exemplary additives include fillers, reinforcing agents, antioxidants, heat stabilizers, light stabilizers, ultraviolet (UV) light stabilizers, plasticizers, lubricants, mold release agents, antistatic agents, colorants such as titanium dioxide, carbon black, and organic dyes, surface effect additives, radiation stabilizers, flame retardants, and anti-drip agents. A combination of additives can be used, for example a combination of a heat stabilizer, mold release agent, and ultraviolet light stabilizer. In general, the additives are used in the amounts generally known to be effective. The total amount of additives (other than any impact modifier, filler, or reinforcing agents) is generally 0.01 to 5 wt. %, based on the total weight of the composition.

Exemplary light stabilizer additives include benzotriazoles such as 2-(2-hydroxy-5-methylphenyl)benzotriazole, 2-(2-hydroxy-5-tert-octylphenyl)-benzotriazole and 2-hydroxy-4-n-octoxy benzophenone, or combinations comprising at least one of the foregoing light stabilizers. Light stabilizers are used in amounts of 0.01 to 5 parts by weight, based on 100 parts by weight of the total composition, excluding any filler.

UV light absorbing stabilizers include triazines, dibenzoylresorcinols (such as TINUVIN* 1577 commercially available from BASF and ADK STAB LA-46 commercially available from Asahi Denka), hydroxybenzophenones; hydroxybenzotriazoles; hydroxyphenyl triazines (e.g., 2-hydroxyphenyl triazine); hydroxybenzotriazines; cyanoacrylates; oxanilides; benzoxazinones; 2-(2H-benzotriazol-2-yl)-4-(1,1,3,3-tetramethylbutyl)-phenol (CYASORB* 5411); 2-hydroxy-4-n-octyloxybenzophenone (CYASORB* 531); 2-[4,6-bis(2,4-dimethylphenyl)-1,3,5-triazin-2-yl]-5-(octyloxy)-phenol (CYASORB* 1164); 2,2'-(1,4-phenylene) bis(4H-3,1-benzoxazin-4-one) (CYASORB* UV-3638); 1,3-bis[(2-cyano-3,3-diphenylacryloyl)oxy]-2,2-bis[[(2- cyano-3,3-diphenylacryloyl)oxy]methyl]propane (UVI-NUL* 3030); 2,2'-(1,4-phenylene) bis(4H-3,1-benzoxazin-4-one); 1,3-bis[[(2-cyano-3,3-diphenylacryloyl)oxy]-2,2-bis[[(2-cyano-3,3-diphenylacryloyl)oxy]methyl]propane; nano-size inorganic materials such as titanium oxide, cerium oxide, and zinc oxide, all with a particle size less than or equal to 100 nanometers, or combinations comprising at least one of the foregoing UV light absorbing stabilizers. UV light absorbing stabilizers are used in amounts of 0.01 to 5 parts by weight, based on 100 parts by weight of the total composition, excluding any filler.

The thickness of the sheet can vary depending upon the desired end use of the sheet. The sheet can comprise a monolithic (e.g., one wall, one layer) sheet. Generally, the thickness of the sheet can be less than or equal to 3 millimeters (mm), for example, 25 micrometers (µm) to 3 mm, for example, 50 µm to 2000 µm, for example, 150 µm to 1000 µm, as well as any and all ranges and endpoints located therebetween.

A coating layer can optionally be present. If present, the thickness of coating layer(s) can vary depending upon the desired end use of the sheet. Generally, the thickness of the coating layer(s) can be less than or equal to 50 µm, for example, 2 to 40 µm, for example, 3 to 30 µm, as well as any and all ranges and endpoints located therebetween.

If present, the coating can include a UV blocking layer to provide optical properties such as enhanced weatherability for underlying layers. If present, the UV blocking layer can be disposed on either surface of the sheet. In an exemplary embodiment, the UV blocking layer comprises a polycarbonate which includes a homopolycarbonate, copolycarbonate, a branched polycarbonate, or a combination comprising at least one of the foregoing polycarbonates. Optionally, the UV blocking layer can contain an effective amount of a flame retardant, as previously described herein. In a specific embodiment, where improved chemical resistance is needed, the UV blocking layer comprises a blend of a polycarbonate with a polyester, such as PCCD. The UV blocking layer also includes at least one ultra violet absorber (UVA), such as, for example, benzotriazoles, o-hydroxybenzophenones, dibenzoylresorcinols, cyanoacrylates, triazines, formamidines, oxanilides and benzoxazinones. Other UVA's can be used without limitation. In a specific embodiment, a UV blocking layer has a thickness 10 to 250 µm. In another specific embodiment, the UV blocking layer comprises 2 to 10 wt % UVA based on the total weight of UV blocking layer. In another specific embodiment, the UV blocking absorber is co-extruded on The sheets disclosed herein can also possess desirable thermal shrinkage in both the machine direction and the transverse direction. For example, the sheet can have a thermal shrinkage of less than or equal to 1.4% in the machine direction, for example, less than or equal to 1.0%, for example, less than or equal to 0.6%, for example, less than or equal to 0.5%, for example, less than or equal to 0.4%, for example, less than or equal to 0.1% when tested after exposure to a temperature of 150° C. for 30 minutes. The sheet can have a thermal shrinkage of less than or equal to 0.6% in the transverse direction, for example, less than or equal to 0.5%, for example, less than or equal to 0.3%, for example, less than or equal to 0.2%, for example, less than or equal to 0.1% when tested after exposure to a temperature of 150° C. for 30 minutes as tested according to ASTM D1204-2002. Desirable values for thermal shrinkage in the transverse direction (TD) are less than or equal to 1.0, while desirable values for thermal shrinkage in the machine direction (MD) are less than or equal to 1.5. The sheets disclosed herein can pass a mandrel bending test around a 0.25 inch diameter cylindrical rod without cracking after exposure to a temperature of 160° C. in air for 500 hours. The sheets disclosed herein can have a UL94 rating of VTM-1, VTM-0, or HB at a thickness of 0.25 mm.

As described herein, all reference to a sheet also includes and encompasses films. The terms "sheet" and "film" are used interchangeably herein. The sheets disclosed herein can be utilized in a variety of applications, including, but not limited to photovoltaic module (e.g., a backsheet in a photovoltaic module), a solar hot water system, lithium-ion battery insulation (e.g., an insulation film), heat shielding (e.g., shielding applications in power supply housing), printed circuit board insulation, aircraft interior applications, railcar interior applications, business equipment insulation, computer rack partitions, or monitor insulation.

Methods of making the sheet are also contemplated. The method can include extruding a monolayer sheet. The monolayer sheet can be made from a composition comprising a combination of polyphenylene, a hydrogenated block copolymer, an aryl salicylate, optionally polystyrene, and optionally, a flame retardant additive. The monolayer sheet can include a composition comprising about 60 to about 90 weight percent of the polyphenylene, for example about 60 to about 85 weight percent, about 10 to about 20 weight percent of the polystyrene, about 3 to about 10 weight percent of an aryl salicylate, and about 10 to about 20 weight percent of the hydrogenated block copolymer. When present, the flame retardant additive can be present in an amount of 5 to 20 weight percent.

A more complete understanding of the components, processes, and apparatuses disclosed herein can be obtained by reference to the accompanying drawings. These figures (also referred to herein as "FIG.") are merely schematic representations based on convenience and the ease of demonstrating the present disclosure, and are, therefore, not intended to indicate relative size and dimensions of the devices or components thereof and/or to define or limit the scope of the exemplary embodiments. Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

FIG. 1 shows a sheet 10 (e.g., a single layer sheet). The sheet 10 has a first surface 14 and a second surface 16 Optionally a first coating layer can be present and disposed upon and in intimate contact (e.g., physical contact) with the first surface 14 and a second coating layer can be disposed upon and in intimate contact with (e.g., physical contact) with the second surface 16.

The following examples are merely illustrative of the sheets disclosed herein and are not intended to limit the scope hereof.

EXAMPLES

In the following examples, sheets were constructed and tested for various physical and mechanical properties.

Thermal shrinkage of the sheets was measured according to ASTM D1204 with a thermal treatment of the sheet at 150° C. for 30 minutes. Accelerated thermal aging was performed by exposing the samples to a temperature of 160° C. in an oven in air for 500 hours. After this, the sheet was bent around a 0.25 inch (0.635 centimeters) mandrel and checked to determine whether the sheet cracked. Tensile properties, i.e., tensile strength at break in the machine directed, tensile elongation at break in the machine directed, retention of tensile strength after a 72 hour pressure cooker test, and retention of tensile strength after a 72 hour pressure cooker test, were measured according to ASTM D882. Accelerated thermal aging properties were evaluated using a pressure cooker test, which exposes the samples in a chamber to the conditions of 121° C., 18 psi (124 kiloPascals) moisture pressure for 72 hours. The Vicat softening temperature was measured according to ISO306. The Vicat softening temperature is generally the temperature at which a flat-ended needle penetrates the specimen to a depth of 1 mm under a specific load. In the present samples, the Vicat A test was conducted wherein a test specimen was placed in the testing apparatus so that the penetrating needle rests on its surface at least 1 mm from the edge. A load of 10 Newtons (N) was applied to the specimen. The specimen is then lowered into an oil bath at 23° C. and the temperature raised at a rate of 120° C. per hour until the needle penetrates 1 mm. The sheets were also tested for a UL94 rating to determine flammability properties of the sheets.

Example 1

Monolayer sheets were extruded from the compositions listed in Table 1. The compositions and the corresponding test results of all sheet samples are summarized in Tables 1 and 2. Each sheet had a thickness of 0.25 mm. Shrinkage was measured in percent as were tensile elongation at break in the machine direction (MD), retention of tensile strength after a 72 hour pressure cooker test, and retention of tensile elongation after a 72 hour pressure cooker test. Tensile strength at break in the machine direction was measured in MegaPascals (MPa). Shrinkage was measured in percent.

TABLE 1

Composition of Sample Sheets

| Components | 1 | 2 | 3 | 4 | 5 | 6 | 7 | 8 | 9 | 10 |
|---|---|---|---|---|---|---|---|---|---|---|
| 0.40IV PPO | | 84.2 | 67.90 | 72.60 | 77.40 | 74.10 | 74.10 | | 60.00 | 67.90 |
| 0.46IV PPO | 84.5 | | | | | | | 74.10 | | |
| POLYSTYRENE | | | 5.00 | | | | | | 7.90 | |
| High Mw SEBS (Kraton G1651H) | 5.6 | 5.6 | | | | | | | | |
| Low/medium Mw SEBS (Kraton G1650) | | | | 15.00 | 10.00 | 9.00 | | | 20.50 | 20.00 |
| Low Mw Kraton FG1901X | | | 15.00 | | | | 9.00 | 9.00 | | |
| PSal-A, milled* | | | 4.70 | 5.00 | 5.20 | 5.00 | 5.00 | 5.00 | 4.20 | 4.70 |
| BPADP** | | | 5.00 | 5.00 | 5.00 | 9.50 | 9.50 | 9.50 | 5.00 | 5.00 |
| RDP*** | 7.9 | 7.9 | | | | | | | | |
| LLDPE, GRANULAR, | 0.60 | 0.90 | 0.60 | 0.60 | 0.60 | 0.60 | 0.60 | 0.60 | 0.60 | 0.60 |
| HINDERED PHENOL STABILIZER | 1.1 | 1.1 | 0.50 | 0.50 | 0.50 | 0.50 | 0.50 | 0.50 | 0.50 | 0.50 |
| SEENOX 412S**** | 0.1 | 0.1 | | | | | | | | |
| ZINC SULFIDE | 0.3 | 0.3 | 0.20 | 0.20 | 0.20 | 0.20 | 0.20 | 0.20 | 0.20 | 0.20 |
| MAGNESIUM OXIDE | | | 0.20 | 0.20 | 0.20 | 0.20 | 0.20 | 0.20 | 0.20 | 0.20 |
| PHOSPHITE STABILIZER | | | 0.30 | 0.30 | 0.30 | 0.30 | 0.30 | 0.30 | 0.30 | 0.30 |
| Irganox MD1024 | | | 0.10 | 0.10 | 0.10 | 0.10 | 0.10 | 0.10 | 0.10 | 0.10 |
| Carbon black | | | 0.50 | 0.50 | 0.50 | 0.50 | 0.50 | 0.50 | 0.50 | 0.50 |

*PSal-A = Polysalicylate Acetate
**BPADP = Bisphenol-A Bis (diphenyl Phosphate)
***RDP = Resorcinol Bis(diphenyl phosphate)
****SEENOX412S = Pentaerythritol tetrakis (beta-lauryl Crompton thiopropionate)

TABLE 2

Test Results from Sheets made from compositions of Table 1

| Sample No. | | 1 | 2 | 3 | 4 | 5 | 6 | 7 | 8 | 9 | 10 |
|---|---|---|---|---|---|---|---|---|---|---|---|
| Film Thickness | mm | 0.25 | 0.25 | 0.25 | 0.25 | 0.25 | 0.25 | 0.25 | 0.25 | 0.25 | 0.25 |
| Vicat (10A/120) | ° C. | 171 | 171 | 153 | 170 | 174 | 159 | 156 | 156 | 156 | 166 |
| Shrinkage at 150 C./30 min (%) | MD | 0.3% | 0.3% | 0.4% | 0.1% | 0.4% | 1.0% | 1.3% | 1.4% | 1.0% | 0.6% |
| | TD | 0.3% | 0.3% | 0.4% | 0.1% | 0.2% | 0.3% | 0.4% | 0.6% | 0.5% | 0.1% |
| UL94-result | | VTM0 | V0 | HB | HB | HB | VTM-1 | VTM-1 | VTM-0 | HB | HB |
| Ten. Str. at break (MD) | MPa | 64 | 71 | 50 | 57 | 64 | 72 | 69 | 62 | 48 | 49 |
| Ten. Elong. at break (MD) | % | 7 | 9 | 11 | 12 | 9 | 5 | 6 | 6 | 10 | 14 |
| retention of TS after PCT72 hr | % | 113% | 121% | 116% | 108% | 119% | 109% | 115% | 127% | 109% | 102% |

TABLE 2-continued

Test Results from Sheets made from compositions of Table 1

| Sample No. | | 1 | 2 | 3 | 4 | 5 | 6 | 7 | 8 | 9 | 10 |
|---|---|---|---|---|---|---|---|---|---|---|---|
| retention of TE after PCT72 hr | % | 36% | 66% | 51% | 49% | 87% | 101% | 55% | 25% | 41% | 51% |
| ¼" mandrel bending test after 500 hour aging at 160° C. in air | | C | C | NB | NB | NB | NB | NB | NB | NB | NB |

*C = Crack
**NB = not broken, no crack

As can be seen from Table 2, the samples made with the compositions disclosed herein possess superior thermal aging properties as compared to the samples that contained a different composition, e.g., did not contain polysalicylate. All of the samples containing polysalicylate did not crack after the thermal aging process (Samples 3-10), while each of the samples that did not contain the polysalicylate did crack after the thermal gaining test (Samples 1 and 2). As demonstrated in Table 2, Samples 3 to 10 were able to retain tensile strength and tensile elongate, while maintaining heat deformation resistance and other mechanical properties as compared to Samples 1 and 2. This can be seen for example with respect to Samples 1 and 2 both of which cracked after heat aging in the bending test. All of Samples 3 to 10, containing the compositions disclosed herein, were able to pass the mandrel test with no breakage after aging. Additionally, each of Samples 3 to 10 were able to retain at least 102% of tensile strength after being subjected to the pressure cooker test for 72 hours. Tensile elongation was also retained in Samples 3 to 10 with Samples 5 and 6 having especially high retention of tensile elongation.

The sheets and methods of making thereof disclosed herein include(s) at least the following aspects:

Aspect 1: A sheet, comprising: a composition comprising about 60 to about 85 weight percent of polyphenylene, about 0 to about 10 weight percent of polystyrene, about 10 to about 20 weight percent of a hydrogenated block copolymer of an alkenyl aromatic compound and a conjugated diene, about 3 to about 10 weight percent of an aryl salicylate, and optionally, a flame retardant additive.

Aspect 2: The sheet of Aspect 1, wherein the polyphenylene comprises poly(phenylene ether).

Aspect 3: The sheet of Aspect 1 or Aspect 2, wherein the polyphenylene has an intrinsic viscosity of 0.25 to 0.50, preferably wherein the intrinsic viscosity is 0.40 to 0.46.

Aspect 4: The sheet of any of the preceding aspects, wherein the hydrogenated block copolymer has a weight average molecular weight of 100,000 to 150,000.

Aspect 5: The sheet of any of the preceding aspects, wherein the flame retardant additive is present in an amount of 3 to 20 weight percent.

Aspect 6: The sheet of any of the preceding aspects, wherein the flame retardant additive comprises a halogen containing flame retardant additive, a non-halogen containing flame retardant additive, or a combination comprising at least one of the foregoing, preferably wherein the halogen containing flame retardant additive comprises a phosphorous containing flame retardant additive.

Aspect 7: The sheet of any of the preceding aspects, wherein the aryl salicylate comprises polysalicylate.

Aspect 8: The sheet of any of the preceding aspects, wherein the composition further comprises an ultraviolet light stabilizer, an ultraviolet light absorber, or a combination comprising at least one of the foregoing.

Aspect 9: The sheet of any of the preceding aspects, wherein the hydrogenated block copolymer of an alkenyl aromatic compound and a conjugated diene comprises a hydrogenated diblock or triblock copolymers of polystyrene and polyethylene-butylene, or a combination comprising at least one of the foregoing, preferably wherein the hydrogenated diblock or triblock copolymers comprise styrene ethylene butene, styrene ethylene butene styrene, or a combination comprising at least one of the foregoing.

Aspect 10: The sheet of any of the preceding aspects, wherein the sheet has a Vicat Softening temperature of greater than or equal to 150° C.

Aspect 11: The sheet of any of the preceding aspects, wherein a thickness of the sheet is 50 micrometers to 3 millimeters.

Aspect 12: The sheet of any of the preceding aspects, wherein the sheet passes a mandrel bending test around a 0.25 inch diameter cylindrical rod without cracking after exposure to a temperature of 160° C. in air for 500 hours.

Aspect 13: The sheet of any of the preceding aspects, wherein thermal shrinkage of the sheet at 150° C. for 30 minutes is less than or equal to 1.5% in the machine direction and less than or equal to 0.6% in the transverse direction.

Aspect 14: The sheet of any of the preceding aspects, wherein the sheet has a UL94 rating of VTM1 at a thickness of 0.25 millimeters.

Aspect 15: An article comprising the sheet of any of the preceding aspects, wherein the article is selected from a photovoltaic module, a solar hot water system, lithium-ion battery insulation, heat shielding, printed circuit board insulation, aircraft interior applications, railcar interior applications, business equipment insulation, computer rack partitions, or monitor insulation.

Aspect 16: A method of making a sheet, comprising: extruding a sheet, wherein the sheet comprises a composition comprising about 60 to about 75 weight percent of polyphenylene, about 0 to about 10 weight percent of polystyrene, about 10 to about 20 weight percent of a hydrogenated block copolymer of an alkenyl aromatic compound and a conjugated diene, about 3 to about 10 weight percent of an aryl salicylate, and optionally, a flame retardant additive.

Aspect 17: A backsheet for a photovoltaic module, comprising: a sheet, wherein the sheet comprises a composition comprising about 60 to about 75 weight percent of poly(phenylene ether), about 0 to about 10 weight percent of polystyrene, about 10 to about 20 weight percent of a hydrogenated diblock or triblock copolymer comprising styrene ethylene butene, styrene ethylene butene styrene, or a combination comprising at least one of the foregoing, about 3 to about 10 weight percent of polysalicylate, and about 3 to about 20 weight percent of a flame retardant additive.

Aspect 18: The backsheet of Aspect 17, wherein the wherein the flame retardant additive comprises a halogen containing flame retardant additive, a non-halogen containing flame retardant additive, or a combination comprising at least one of the foregoing, preferably wherein the halogen containing flame retardant additive comprises a phosphorous containing flame retardant additive.

Aspect 19: The backsheet of Aspect 17 or Aspect 18, wherein the composition comprises an ultraviolet light stabilizer.

Aspect 20: The backsheet of any of Aspects 17-19, wherein the backsheet passes a mandrel bending test around a 0.25 inch diameter cylindrical rod without cracking after exposure to a temperature of 160° C. in air for 500 hours.

The compositions, methods, and articles can alternatively comprise, consist of, or consist essentially of, any appropriate materials, steps, or components herein disclosed. The compositions, methods, and articles can additionally, or alternatively, be formulated so as to be devoid, or substantially free, of any materials (or species), steps, or components, that are otherwise not necessary to the achievement of the function or objectives of the compositions, methods, and articles.

The term "alkyl" means a branched or straight chain, unsaturated aliphatic hydrocarbon group, e.g., methyl, ethyl, n-propyl, i-propyl, n-butyl, s-butyl, t-butyl, n-pentyl, s-pentyl, and n- and s-hexyl. "Alkenyl" means a straight or branched chain, monovalent hydrocarbon group having at least one carbon-carbon double bond (e.g., ethenyl (—HC=CH$_2$)). "Alkoxy" means an alkyl group that is linked via an oxygen (i.e., alkyl-O—), for example methoxy, ethoxy, and sec-butyloxy groups. "Alkylene" means a straight or branched chain, saturated, divalent aliphatic hydrocarbon group (e.g., methylene (—CH$_2$—) or, propylene (—(CH$_2$)$_3$—)). "Cycloalkylene" means a divalent cyclic alkylene group, —C$_n$H$_{2n-x}$, wherein x is the number of hydrogens replaced by cyclization(s). "Cycloalkenyl" means a monovalent group having one or more rings and one or more carbon-carbon double bonds in the ring, wherein all ring members are carbon (e.g., cyclopentyl and cyclohexyl). "Aryl" means an aromatic hydrocarbon group containing the specified number of carbon atoms, such as phenyl, tropone, indanyl, or naphthyl. "Arylene" means a divalent aryl group. "Alkylarylene" means an arylene group substituted with an alkyl group. "Arylalkylene" means an alkylene group substituted with an aryl group (e.g., benzyl). The prefix "halo" means a group or compound including one more of a fluoro, chloro, bromo, or iodo substituent. A combination of different halo groups (e.g., bromo and fluoro), or only chloro groups can be present. The prefix "hetero" means that the compound or group includes at least one ring member that is a heteroatom (e.g., 1, 2, or 3 heteroatom(s)), wherein the heteroatom(s) is each independently N, O, S, Si, or P. "Substituted" means that the compound or group is substituted with at least one (e.g., 1, 2, 3, or 4) substituents that can each independently be a C$_{1-9}$ alkoxy, a C$_{1-9}$ haloalkoxy, a nitro (—NO$_2$), a cyano (—CN), a C$_{1-6}$ alkyl sulfonyl (—S(=O)$_2$-alkyl), a C$_{6-12}$ aryl sulfonyl (—S(=O)$_2$-aryl) a thiol (—SH), a thiocyano (—SCN), a tosyl (CH$_3$C$_6$H$_4$SO$_2$—), a C$_{3-12}$ cycloalkyl, a C$_{2-12}$ alkenyl, a C$_{5-12}$ cycloalkenyl, a C$_{6-12}$ aryl, a C$_{7-13}$ arylalkylene, a C$_{4-12}$ heterocycloalkyl, and a C$_{3-12}$ heteroaryl instead of hydrogen, provided that the substituted atom's normal valence is not exceeded. The number of carbon atoms indicated in a group is exclusive of any substituents. For example —CH$_2$CH$_2$CN is a C$_2$ alkyl group substituted with a nitrile.

Unless substituents are otherwise specifically indicated, each of the foregoing groups can be unsubstituted or substituted, provided that the substitution does not significantly adversely affect synthesis, stability, or use of the compound. "Substituted" means that the compound, group, or atom is substituted with at least one (e.g., 1, 2, 3, or 4) substituents instead of hydrogen, where each substituent is independently nitro (—NO$_2$), cyano (—CN), hydroxy (—OH), halogen, thiol (—SH), thiocyano (—SCN), C$_{1-6}$ alkyl, C$_{2-6}$ alkenyl, C$_{2-6}$ alkynyl, C$_{1-6}$ haloalkyl, C$_{1-9}$ alkoxy, C$_{1-6}$ haloalkoxy, C$_{3-12}$ cycloalkyl, C$_{5-18}$ cycloalkenyl, C$_{6-12}$ aryl, C$_{7-13}$ arylalkylene (e.g., benzyl), C$_{7-12}$ alkylarylene (e.g., toluyl), C$_{4-12}$ heterocycloalkyl, C$_{3-12}$ heteroaryl, C$_{1-6}$ alkyl sulfonyl (—S(=O)$_2$-alkyl), C$_{6-12}$ arylsulfonyl (—S(=O)$_2$-aryl), or tosyl (CH$_3$C$_6$H$_4$SO$_2$—), provided that the substituted atom's normal valence is not exceeded, and that the substitution does not significantly adversely affect the manufacture, stability, or desired property of the compound. When a compound is substituted, the indicated number of carbon atoms is the total number of carbon atoms in the compound or group, including those of any substituents.

In general, the invention may alternately comprise, consist of, or consist essentially of, any appropriate components herein disclosed. The invention may additionally, or alternatively, be formulated so as to be devoid, or substantially free, of any components, materials, ingredients, adjuvants or species used in the prior art compositions or that are otherwise not necessary to the achievement of the function and/or objectives of the present invention. The endpoints of all ranges directed to the same component or property are inclusive and independently combinable (e.g., ranges of "less than or equal to 25 wt %, or 5 wt % to 20 wt %," is inclusive of the endpoints and all intermediate values of the ranges of "5 wt % to 25 wt %," etc.). Disclosure of a narrower range or more specific group in addition to a broader range is not a disclaimer of the broader range or larger group. "Combination" is inclusive of blends, mixtures, alloys, reaction products, and the like. Furthermore, the terms "first," "second," and the like, herein do not denote any order, quantity, or importance, but rather are used to denote one element from another. The terms "a" and "an" and "the" herein do not denote a limitation of quantity, and are to be construed to cover both the singular and the plural, unless otherwise indicated herein or clearly contradicted by context. "Or" means "and/or." The suffix "(s)" as used herein is intended to include both the singular and the plural of the term that it modifies, thereby including one or more of that term (e.g., the film(s) includes one or more films). Reference throughout the specification to "one embodiment", "another embodiment", "an embodiment", and so forth, means that a particular element (e.g., feature, structure, and/or characteristic) described in connection with the embodiment is included in at least one embodiment described herein, and may or may not be present in other embodiments. In addition, it is to be understood that the described elements may be combined in any suitable manner in the various embodiments.

The modifier "about" used in connection with a quantity is inclusive of the stated value and has the meaning dictated by the context (e.g., includes the degree of error associated with measurement of the particular quantity). The notation "±10%" means that the indicated measurement can be from an amount that is minus 10% to an amount that is plus 10% of the stated value. The terms "front", "back", "bottom", and/or "top" are used herein, unless otherwise noted, merely for convenience of description, and are not limited to any one position or spatial orientation. "Optional" or "optionally" means that the subsequently described event or circumstance can or cannot occur, and that the description includes instances where the event occurs and instances where it does not. Unless defined otherwise, technical and scientific terms used herein have the same meaning as is commonly understood by one of skill in the art to which this invention belongs. A "combination" is inclusive of blends, mixtures, alloys, reaction products, and the like.

Unless otherwise specified herein, any reference to standards, regulations, testing methods and the like, such as ASTM D1003, ASTM D4935, ASTM 1746, FCC part 18, CISPR11, and CISPR 19 refer to the standard, regulation, guidance or method that is in force at the time of filing of the present application.

As used herein, the term "hydrocarbyl" and "hydrocarbon" refers broadly to a substituent comprising carbon and hydrogen, optionally with 1 to 3 heteroatoms, for example, oxygen, nitrogen, halogen, silicon, sulfur, or a combination thereof; "alkyl" refers to a straight or branched chain, saturated monovalent hydrocarbon group; "alkylene" refers to a straight or branched chain, saturated, divalent hydrocarbon group; "alkylidene" refers to a straight or branched chain, saturated divalent hydrocarbon group, with both valences on a single common carbon atom; "alkenyl" refers to a straight or branched chain monovalent hydrocarbon group having at least two carbons joined by a carbon-carbon double bond; "cycloalkyl" refers to a non-aromatic monovalent monocyclic or multicylic hydrocarbon group having at least three carbon atoms, "cycloalkenyl" refers to a non-aromatic cyclic divalent hydrocarbon group having at least three carbon atoms, with at least one degree of unsaturation; "aryl" refers to an aromatic monovalent group containing only carbon in the aromatic ring or rings; "arylene" refers to an aromatic divalent group containing only carbon in the aromatic ring or rings; "alkylaryl" refers to an aryl group that has been substituted with an alkyl group as defined above, with 4-methylphenyl being an exemplary alkylaryl group; "arylalkyl" refers to an alkyl group that has been substituted with an aryl group as defined above, with benzyl being an exemplary arylalkyl group; "acyl" refers to an alkyl group as defined above with the indicated number of carbon atoms attached through a carbonyl carbon bridge (—C(=O)—); "alkoxy" refers to an alkyl group as defined above with the indicated number of carbon atoms attached through an oxygen bridge (—O—); and "aryloxy" refers to an aryl group as defined above with the indicated number of carbon atoms attached through an oxygen bridge (—O—).

Unless otherwise indicated, each of the foregoing groups can be unsubstituted or substituted, provided that the substitution does not significantly adversely affect synthesis, stability, or use of the compound. The term "substituted" as used herein means that at least one hydrogen on the designated atom or group is replaced with another group, provided that the designated atom's normal valence is not exceeded. When the substituent is oxo (i.e., =O), then two hydrogens on the atom are replaced. Combinations of substituents and/or variables are permissible provided that the substitutions do not significantly adversely affect synthesis or use of the compound. Exemplary groups that can be present on a "substituted" position include, but are not limited to, cyano; hydroxyl; nitro; azido; alkanoyl (such as a $C_{2-6}$ alkanoyl group such as acyl); carboxamido; $C_{1-6}$ or $C_{1-3}$ alkyl, cycloalkyl, alkenyl, and alkynyl (including groups having at least one unsaturated linkages and from 2 to 8, or 2 to 6 carbon atoms); $C_{1-6}$ or $C_{1-3}$ alkoxys; $C_{6-10}$ aryloxy such as phenoxy; $C_{1-6}$ alkylthio; $C_{1-6}$ or $C_{1-3}$ alkylsulfinyl; $C_{1-6}$ or $C_{1-3}$ alkylsulfonyl; aminodi($C_{1-6}$ or $C_{1-3}$)alkyl; $C_{6-12}$ aryl having at least one aromatic rings (e.g., phenyl, biphenyl, naphthyl, or the like, each ring either substituted or unsubstituted aromatic); $C_{7-19}$ arylalkyl having 1 to 3 separate or fused rings and from 6 to 18 ring carbon atoms; or arylalkoxy having 1 to 3 separate or fused rings and from 6 to 18 ring carbon atoms, with benzyloxy being an exemplary arylalkoxy.

All cited patents, patent applications, and other references are incorporated herein by reference in their entirety. However, if a term in the present application contradicts or conflicts with a term in the incorporated reference, the term from the present application takes precedence over the conflicting term from the incorporated reference.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

What is claimed is:

1. A composition, comprising:
   67.90 to 72.6 weight percent of poly(phenylene ether),
   15 to 20 weight percent of a hydrogenated block copolymer of an alkenyl aromatic compound and a conjugated diene,
   4.7 to 5 weight percent of polysalicylate acetate, and
   5 to 9.5 weight percent of a phosphorous-containing flame retardant additive, percentages based on 100 parts by weight total of the poly(phenylene ether), the hydrogenated block copolymer, the polysalicylate acetate, and the phosphorous-containing flame retardant additive,
   wherein the hydrogenated block copolymer is a hydrogenated polystyrene-poly(ethylene-butylene)-polystyrene block copolymer having a weight average molecular weight of 100,000 to 150,000, and
   wherein the phosphorous-containing flame retardant additive is bisphenol-A bis(diphenyl phosphate).

2. A sheet, comprising the composition of claim 1.

3. The sheet of claim 2, wherein the poly(phenylene ether) has an intrinsic viscosity of 0.25 to 0.50 deciliter per gram.

4. The sheet of claim 2, wherein the composition further comprises an ultraviolet light stabilizer, an ultraviolet light absorber, or a combination comprising at least one of the foregoing.

5. The sheet of claim 2, wherein the sheet has a Vicat Softening temperature of greater than or equal to 150° C.

6. The sheet of claim 2, wherein a thickness of the sheet is 50 micrometers to 3 millimeters.

7. The sheet of claim 2, wherein the sheet passes a mandrel bending test around a 0.25 inch diameter cylindrical rod without cracking after exposure to a temperature of 160° C. in air for 500 hours.

8. The sheet of claim 2, wherein thermal shrinkage of the sheet at 150° C. for 30 minutes is less than or equal to 0.2% in the machine direction and less than or equal to 0.2% in the transverse direction.

9. The sheet of claim 2, wherein the sheet has a UL94 rating of VTM1 at a thickness of 0.25 millimeters.

10. An article comprising the sheet of claim 2, wherein the article is selected from a photovoltaic module, a solar hot water system, lithium-ion battery insulation, heat shielding, printed circuit board insulation, an aircraft interior application, a railcar interior application, business equipment insulation, a computer rack partition, or monitor insulation.

11. A method of making the sheet of claim 2, comprising:
extruding the sheet, wherein the composition comprises 0 weight percent of polystyrene.

12. A backsheet for a photovoltaic module, comprising:
the sheet of claim 2, wherein the composition comprises 0 weight percent of polystyrene.

13. The backsheet of claim 12, wherein the composition comprises an ultraviolet light stabilizer.

14. The backsheet of claim 12, wherein the backsheet passes a mandrel bending test around a 0.25 inch diameter cylindrical rod without cracking after exposure to a temperature of 160° C. in air for 500 hours.

15. The sheet of claim 2, wherein the poly(phenylene ether) is capped with the polysalicylate acetate.

16. The sheet of claim 2, wherein the sheet is formed by extrusion, wherein the composition comprises 0 weight percent of polystyrene.

17. The sheet of claim 2, wherein the composition comprises 0 weight percent of polystyrene.

\* \* \* \* \*